United States Patent [19]
Hwang et al.

[11] Patent Number: 5,273,915
[45] Date of Patent: Dec. 28, 1993

[54] METHOD FOR FABRICATING BIPOLAR JUNCTION AND MOS TRANSISTORS ON SOI

[75] Inventors: Bor-Yuan Hwang, Tempe; Juergen A. Foerstner, Mesa, both of Ariz.

[73] Assignee: Motorola, Inc., Schaumburg, Ill.

[21] Appl. No.: 956,224

[22] Filed: Oct. 5, 1992

[51] Int. Cl.$^5$ .......................................... H01L 21/265
[52] U.S. Cl. ...................................... 437/34; 437/31; 437/59; 437/60; 148/DIG. 9; 148/DIG. 150
[58] Field of Search ...................... 437/31, 34, 59, 60, 437/21; 148/DIG. 150, DIG. 9

[56] References Cited

U.S. PATENT DOCUMENTS

| | | | |
|---|---|---|---|
| 5,049,513 | 9/1991 | Eklund | 148/DIG. 150 |
| 5,100,810 | 3/1992 | Yoshimi et al. | 437/59 |
| 5,145,796 | 9/1992 | Adan et al. | 148/DIG. 150 |
| 5,164,326 | 11/1992 | Foerstner et al. | 437/34 |

*Primary Examiner*—Tom Thomas
*Assistant Examiner*—Tuan Nguyen
*Attorney, Agent, or Firm*—Rennie William Dover; Joe E. Barbee

[57] ABSTRACT

An SOI wafer (10) is separated into a bipolar junction transistor area (18) and an MOS transistor area (19). A bipolar junction transistor having a collector region (25), and emitter region (44), an inactive base region (33), and an active base region (43) is formed on a thin film of semiconductor material (13) in the bipolar junction transistor area (18). A link between the inactive base region (33) and the active base region (43) is formed from a polysilicon spacer (42) along an edge or sidewall of emitter openings (39 or 40). Simultaneously with the formation of the bipolar junction transistor, MOS transistors are formed in the MOS transistor area (19). Electrically conductive contacts (56) in the bipolar junction transistor area (18) and the MOS transistor area (19) are formed from a silicide. Both complementary bipolar junction transistors and MOS transistors may be formed.

20 Claims, 7 Drawing Sheets

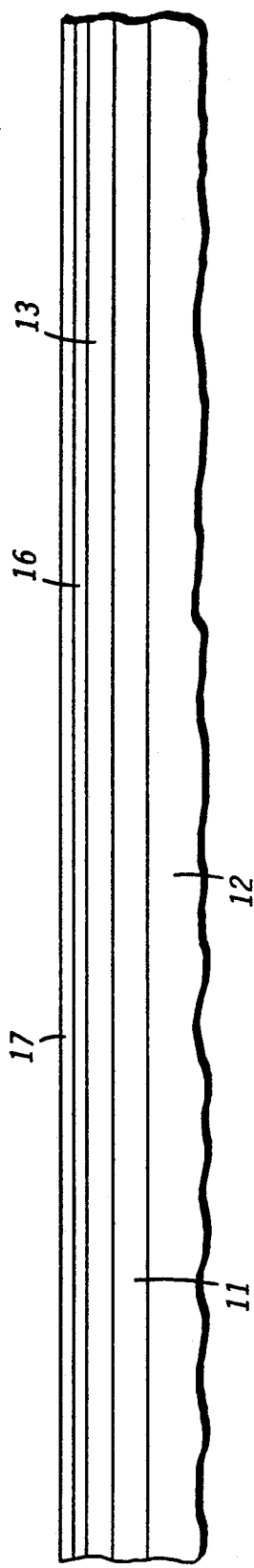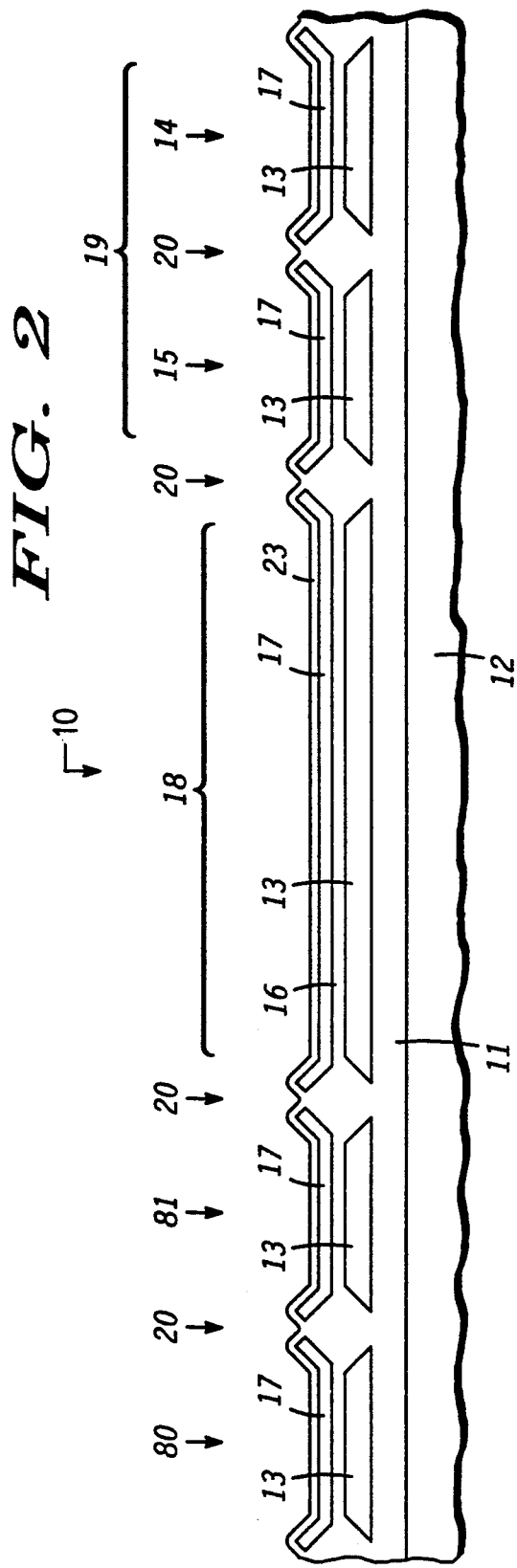

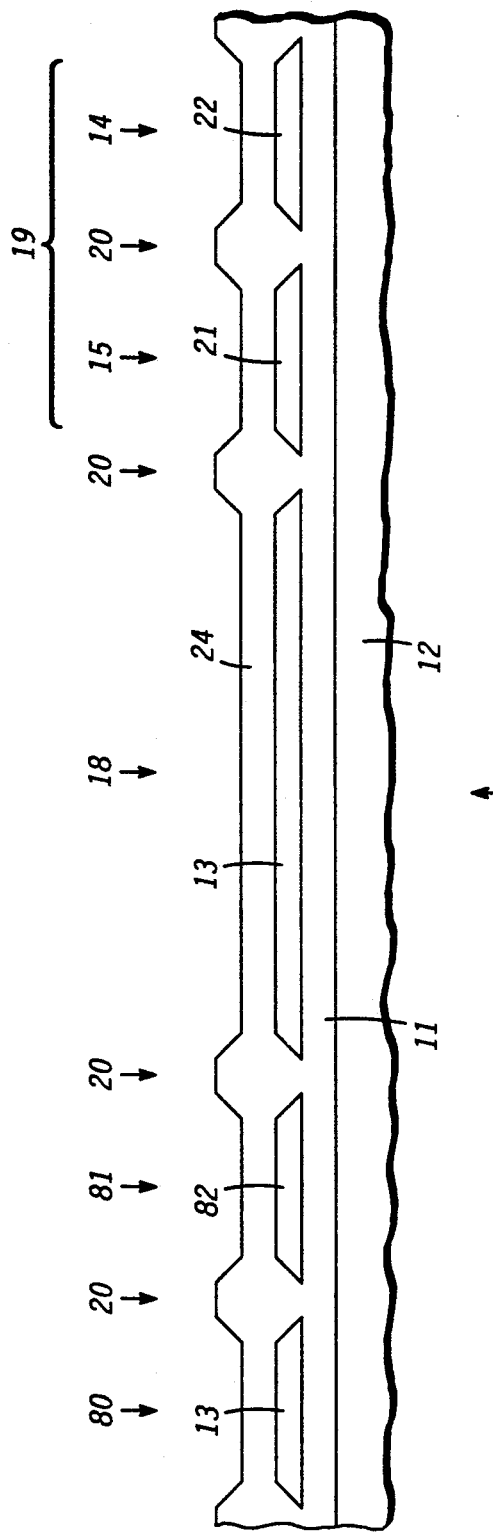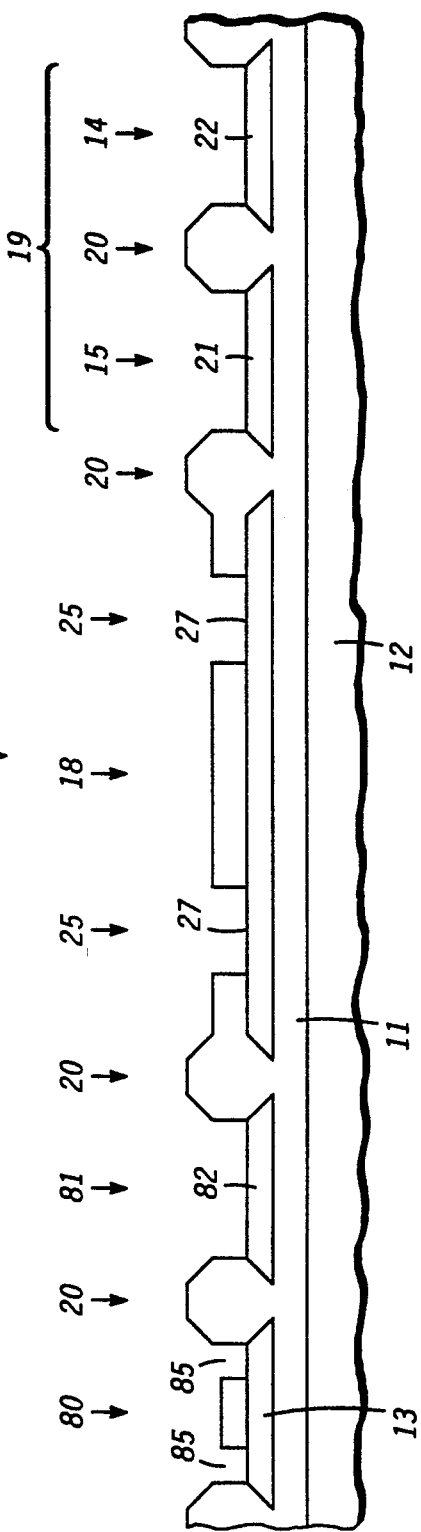

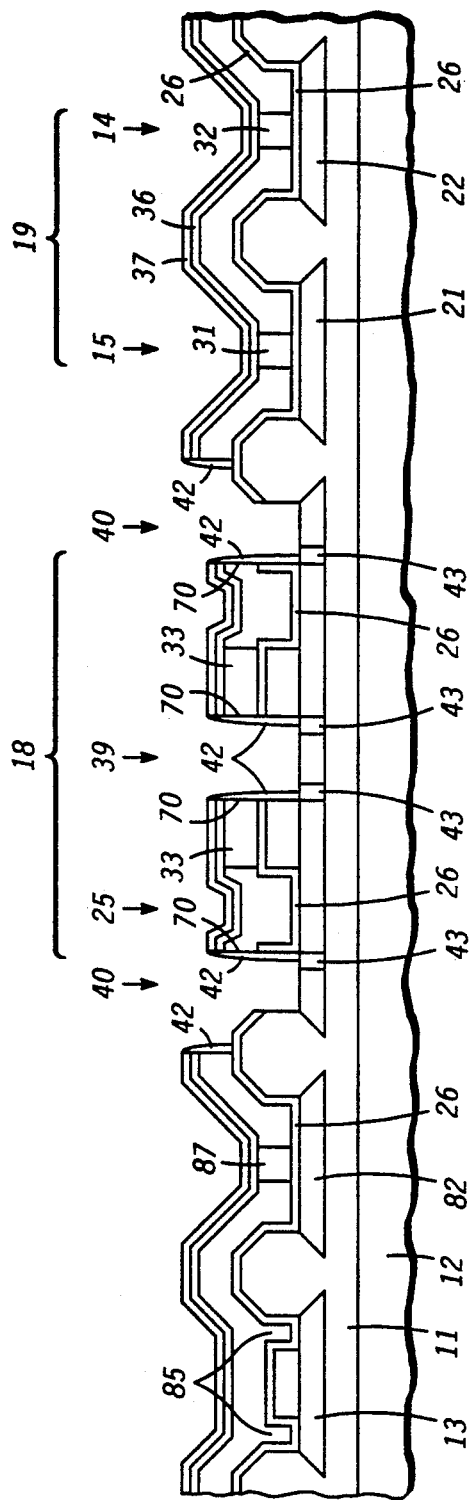
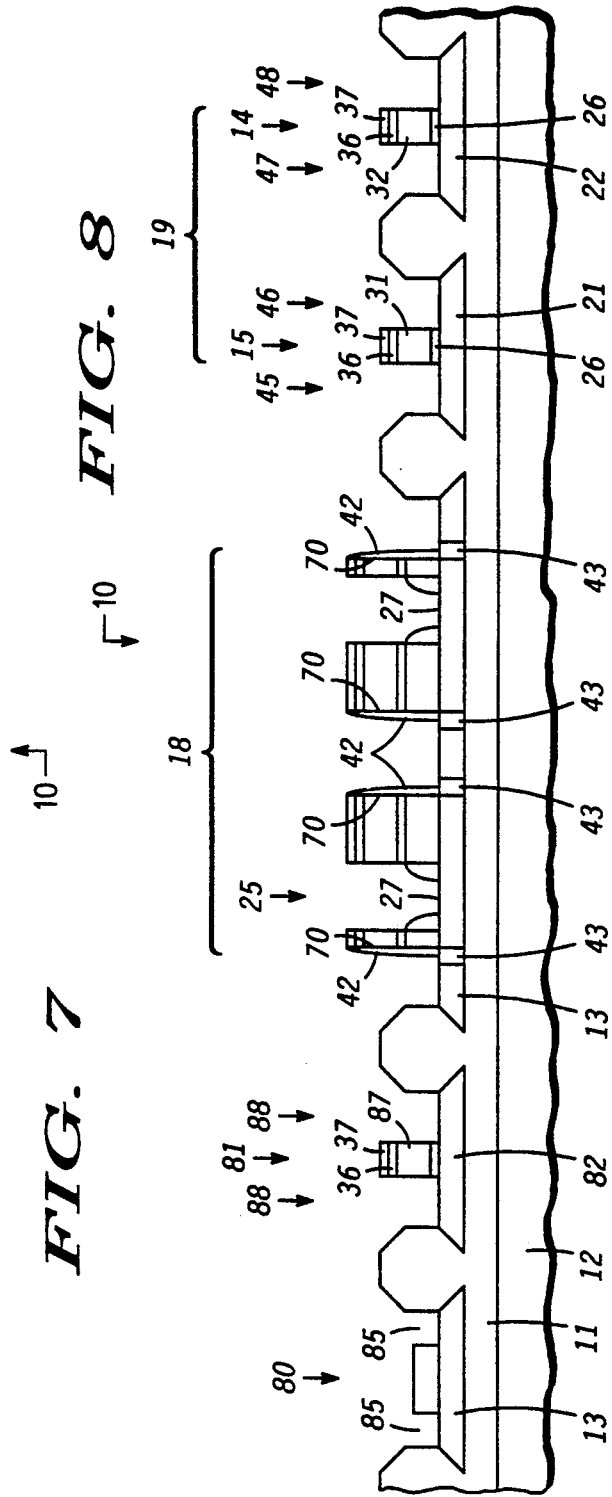

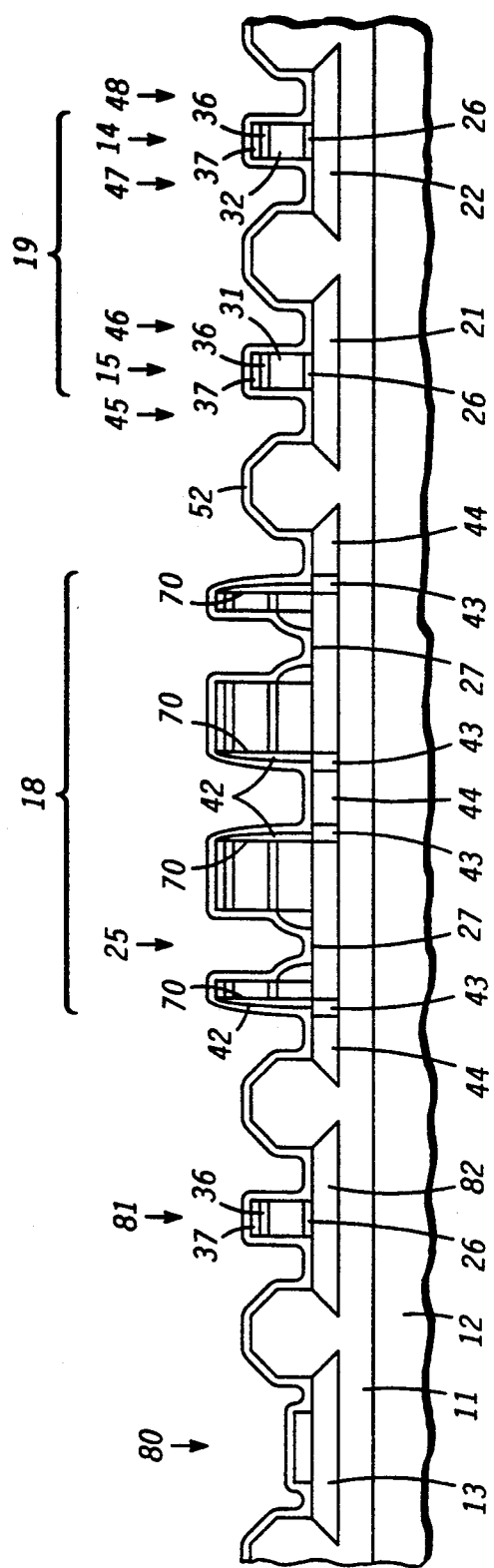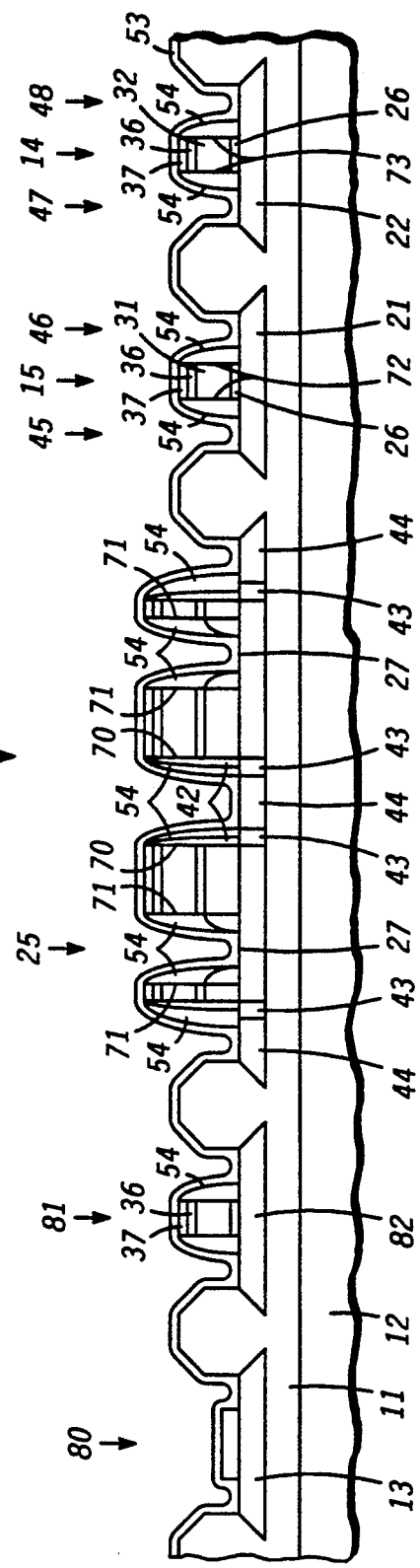

METHOD FOR FABRICATING BIPOLAR JUNCTION AND MOS TRANSISTORS ON SOI

BACKGROUND OF THE INVENTION

The present invention relates, in general, to semiconductor structures and, more particularly, to a silicon on insulator semiconductor structure having both complementary bipolar and CMOS devices.

A fundamental requirement of integrated circuit manufacture is providing electrical isolation between different devices which comprise an integrated circuit. Electrical isolation is particularly important when monolithically integrating bipolar junction transistors with MOS transistors. It has long been recognized that superior isolation may be achieved by using a high quality insulating material such as silicon dioxide rather than by techniques such as p-n junction isolation. More particularly, isolation techniques employing some form of thin film silicon on insulator (SOI) offer the additional advantages of reduced capacitive coupling, elimination of CMOS latch-up, and simpler fabrication techniques.

The prior art includes numerous methods for fabricating bipolar transistors in bulk silicon which utilize a vertically oriented structure. While vertical structures are suitable to bulk silicon, they are difficult to fabricate in a very thin film. In addition, such structures do not take full advantage of the low parasitic potential of thin film SOI. A method for fabricating a horizontal bipolar transistor on an SOI substrate was described in the paper "A Thin-Base Lateral Bipolar Transistor Fabricated on Bonded SOI", by N. Higaki et al., 1991 VLSI symposium technical digest, pages 53 to 54, which is incorporated herein by reference. This method allows for fabrication of bipolar transistors on an SOI substrate, however the method of fabrication produces a long thin base area with electrical contact provided only at either end of the base structure. The resultant high base resistance degrades the device performance, reducing achievable bandwidth, noise, and switching speed. Another method for fabricating a horizontal bipolar transistor on an SOI substrate was presented in the paper "A NOVEL HIGH-PERFORMANCE LATERAL BIPOLAR ON SOI" by G. G. Shahidi et al., 1991 IEDM, pp 26-1.1-26-1.4. This method addresse the base resistance problem, but requires added process complexity to form a polycrystalline silicon spacer on only one side of the base opening.

Accordingly, it would be advantageous to have a method for fabricating both complementary bipolar and CMOS (BiCMOS) devices using a thin film SOI method which allows a much simplified lateral isolation between devices. The method should utilize horizontal device structures so as to minimize parasitic effects, especially base resistance. Ideally, the method should use the minimum number of mask steps, fabricate self-aligned transistors and should integrate fabrication of both complementary bipolar and CMOS devices into a single manufacturing flow requiring a minimum of extra steps devoted solely to one device type.

SUMMARY OF THE INVENTION

Briefly stated, the present invention provides a method for fabricating bipolar junction and MOS transistors on a thin film silicon on insulator substrate. The method includes providing a silicon on insulator substrate comprising a tri-layer structure having an oxide insulating layer sandwiched between a first and a second layer of silicon. The first layer of silicon is separated into a plurality of transistor areas, including a bipolar junction transistor area and an MOS transistor area. A doped region is formed in the MOS transistor area. A gate oxide is formed on the first layer of silicon in the MOS transistor area. A conductive layer is deposited over the bipolar junction and MOS transistor areas. An inactive base region in the bipolar junction transistor area and a gate region in the MOS transistor area are doped. An emitter opening is formed followed by formation of a semiconductor spacer along a sidewall of the emitter opening wherein the semiconductor spacer serves as a link between an active base region and an inactive base region. A source region and a drain region are formed in the MOS transistor area, and a collector contact region is formed in the bipolar transistor area. A dielectric spacer is formed along an edge of the collector contact region, an edge of the first gate region, an edge of the second gate region, and over the semiconductor spacer serving as the link between the active and inactive base regions. Electrical contacts are formed in the source, drain, and gate regions of the MOS transistor area, and in the inactive base, collector, and emitter regions of the bipolar junction transistor area.

BRIEF DESCRIPTION OF THE DRAWINGS

FIG. 1 shows a highly enlarged cross-sectional view of a portion of an SOI starting wafer;

FIG. 2 shows the wafer of FIG. 1 having a plurality of isolation structures formed through a thin film in accordance with the present invention;

FIG. 3 shows the wafer of FIG. 2 having a sacrificial oxide layer disposed thereon;

FIG. 4 shows the wafer of FIG. 3 after selective removal of a sacrificial oxide layer from an MOS transistor area, a collector region, a resistor contact region, and an MOS capacitor area;

FIG. 7 shows the wafer of FIG. 6 after formation of polysilicon spacers;

FIG. 8 shows the wafer of FIG. 7 after formation of collector contact regions and MOS gate regions;

FIG. 9 shows the wafer of FIG. 8 after spacer dielectric deposition;

FIG. 10 shows the wafer of FIG. 9 after formation of dielectric spacers and dielectric layer deposition;

DETAILED DESCRIPTION OF THE DRAWINGS

Figure 5:
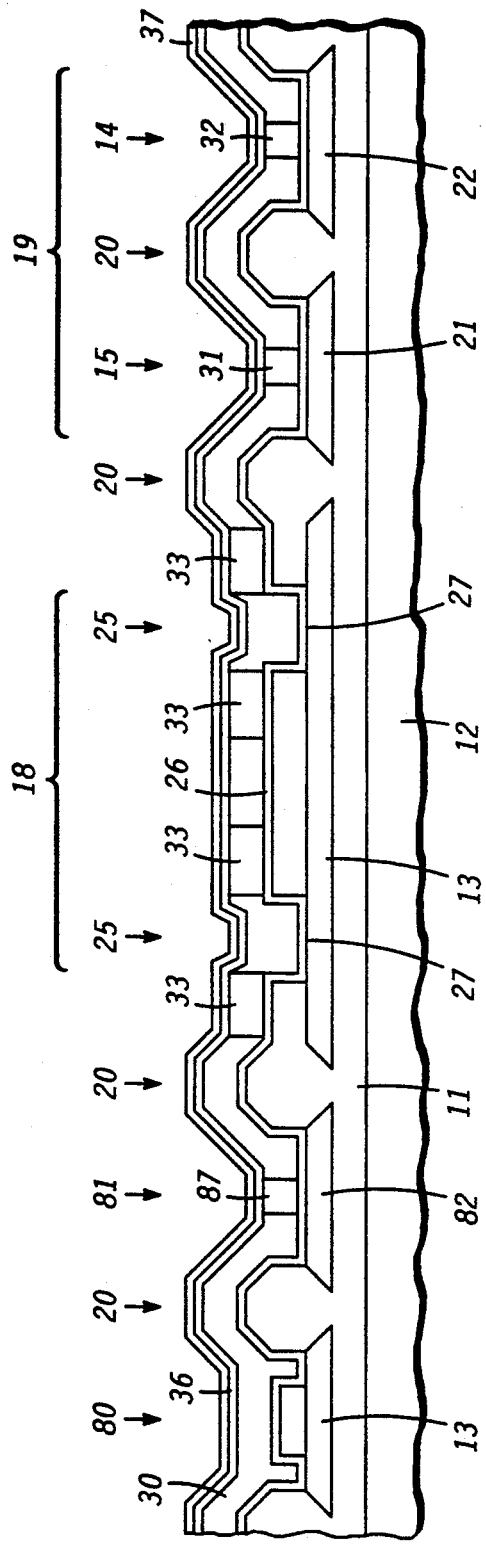
FIG. 5 shows the wafer of FIG. 4 having a gate oxide, a semiconductor layer, an oxide layer and a nitride layer disposed thereon.

FIGS. 1-12 show highly enlarged cross-sectional views of a portion of a semiconductor structure which embodies the present invention during various stages of processing. For clarity, the cross sectional views show four sections of a wafer which illustrate a resistor, a MOS capacitor, a bipolar junction transistor and a pair of MOS transistors fabricated in accordance with the present invention. Both complementary NPN and PNP bipolar junction transistors may be fabricated using the steps illustrated with the appropriate N type and P type doping. Further, a CMOS process for fabricating p-channel and n-channel MOS transistors is illustrated.

FIG. 1 illustrates a highly enlarged cross-sectional view of a portion of a starting wafer 10 having a tri-layer structure, comprising an insulating layer 11 sandwiched between two layers of semiconductor material 12 and 13. In one embodiment, layer 11 is silicon dioxide having a thickness ranging between approximately 0.1 and 1 micrometers ($\mu$m) and layers 12 and 13 are monocrystalline silicon. Layer 11 may be nitride or any suitable insulating material well known in the art. Semiconductor layer 13 may have a thickness ranging between approximately 10 and 500 nanometers (nm). Preferably, semiconductor layer 13 is a thin film of monocrystalline silicon having a thickness of approximately 200 nm. Thus, starting wafer 10 is a silicon on insulator (SOI) wafer.

SOI wafers may be fabricated by either a bonded wafer method, a SIMOX method, a silicon on sapphire method, or the like. A bonded wafer fabrication method suitable for use in the present invention is described in a co-pending U.S. Pat. application having Ser. No. 07/751,001, "Silicon Film With Improved Thickness Control", by J. Foerstner et al., filed Aug. 28, 1991 and assigned to the same assignee as the present application. Co-pending U.S. Pat. application No. 07/751,001 is incorporated herein by reference. Using this wafer fabrication method, starting wafer 10 will have a handle wafer 12 positioned beneath insulating layer 11. Handle wafer 12 serves only as a support for the starting wafer.

Still referring to FIG. 1, a first layer of dielectric material 16 is formed on semiconductor layer 13. Preferably, first layer of dielectric material 16 is an oxide layer which may be formed by either oxide growth or deposition. A second layer of dielectric material 17 is formed on oxide layer 16. Second layer of dielectric material 17 may be a nitride layer which is deposited on oxide layer 16. Layers 16 and 17 extend over a top surface of wafer 10. Preferably, oxide layer 16 has a thickness of approximately 40 nm and nitride layer 17 has a thickness of approximately 150 nm. Oxide layer 16 and nitride layer 17 are commonly referred to as a LOCOS pad oxide 16 and a LOCOS nitride 17, respectively. Methods for forming oxide and nitride layers such as oxide layer 16 and nitride layer 17 are well known to those skilled in the art.

Referring now to FIG. 2, a plurality of isolation structures 20 are formed through thin film 13 thereby forming a plurality of semiconductor islands or thin film semiconductor areas on oxide insulating layer 11. The plurality of semiconductor islands or thin film semiconductor areas may serve as device areas. Further, passive components such as resistors and capacitors may be formed in the plurality of semiconductor islands, thus the passive components are formed from monocrystalline silicon. More particularly, the plurality of semiconductor islands serve as a bipolar junction transistor area 18, a MOS transistor area 19, a resistor area 80, and a MOS capacitor area 81. Forming the plurality of thin film semiconductor areas is also referred to as defining the bipolar junction and MOS transistor areas. To facilitate the description of a BiCMOS transistor, the structure shown in FIG. 2 illustrates a single bipolar junction transistor area 18 and a MOS transistor area 19 having an n-channel MOS transistor portion 14 and a p-channel MOS transistor portion 15. N-channel and p-channel portions 14 and 15, respectively, cooperate to form complementary metal oxide semiconductors (CMOS). It shall be understood that more than a single bipolar junction transistor area 18 and MOS transistor area 19 may be formed and that either NPN or PNP bipolar junction transistors may be fabricated in bipolar junction transistor area 18. Further, a plurality of resistor and capacitor areas 80 and 81, respectfully, may be formed. Isolation structures 20 may be formed by a local oxidation of silicon (LOCOS) technique or other well known SOI isolation techniques.

LOCOS isolation structures 20 are typically fabricated by photolithographic definition followed by growth of an oxide, such as silicon dioxide, using methods well known in the art. Due to the nature of a thin film, the lateral encroachment of oxide beyond the desired area is extremely small. Typical lateral oxide encroachment is as small as 50 nm when thin film 13 is formed from a semiconductor material such as, for example, silicon. Further, formation of LOCOS isolation structure 20 partially oxidizes nitride layer 17 forming an oxide layer 23. In one example oxide layer 23 has a thickness of approximately 10 nm.

An alternate method for isolating areas 18, 19, 80, and 81 is via mesa isolation. Mesa isolation comprises removal of thin film 13 from selected areas by methods well known in the art, thereby forming cavities in the selected areas. The cavities expose portions of insulating layer 11. The portions of semiconductor layer 13 between the cavities form mesas, wherein the mesas are isolated from one another by the cavities. Typically, the cavities formed by removal of the selected areas of thin film 13 are subsequently filled with an insulating material.

Referring now to FIG. 3 and using methods well known in the art, oxide layer 23, nitride layer 17, and oxide layer 16 are removed from the surface of wafer 10, thereby exposing semiconductor layer 13. Subsequently, an insulating layer 24, which may be a sacrificial oxide layer is formed on semiconductor layer 13. Sacrificial oxide layer 24 extends contiguously over the surface of wafer 10. Sacrificial oxide layer 24 may be formed using a wet oxidation process at approximately 900° C., although other methods of forming sacrificial oxide layer 24 are well known to those skilled in the art.

Preferably, sacrificial oxide layer 24 has a uniform thickness ranging between approximately 30 nm and 200 nm. However the thickness of sacrificial oxide layer 24 may be variable in order to differentially adjust the thickness of semiconductor layer 13. For example, it may be desirable to have semiconductor layer 13 thicker in bipolar junction transistor area 18 than in MOS transistor area 19. Accordingly, semiconductor layer 13 may be oxidized in transistor areas 18 and 19 to produce the desired thickness of semiconductor layer 13. Subsequently, a photoresist masking layer may be patterned over sacrificial oxide layer 24 to expose MOS transistor area 19. MOS transistor area 19 is further oxidized thereby consuming more of semiconductor layer 13 in MOS transistor area 19 and decreasing the thickness of semiconductor layer 13 in this area. The photoresist masking layer is removed.

In one embodiment, a doped region 21 of an N type dopant is formed from semiconductor layer 13 in p-channel MOS transistor portion 15, a doped region 22 of a P type dopant is formed from semiconductor layer 13 in n-channel MOS transistor portion 14, and a doped region 82 of an N type dopant is formed from semiconductor layer 13 in MOS capacitor area 81. The N and P type doped regions, 21 and 22 respectively, serve as metal oxide semiconductor (MOS) transistor regions for the complementary metal oxide semiconductors. Isolation wells formed from N type and P type dopants are commonly referred to as N well and P wells, respectively. Doped region 82 serves as one plate of a MOS capacitor.

Suitable N type dopants include phosphorus and arsenic whereas a suitable P type dopant is boron. Methods of forming doped regions such as N regions 21 and 82, and P region 22 are well known to those skilled in the art. Although doped regions 21 and 22 are shown as separated by isolation structures 20, it shall be understood that doped regions 21 and 22 way be formed in a single MOS transistor area 19. Techniques for forming doped regions in a single MOS transistor area in preparation for subsequent formation of complementary metal oxide semiconductors are well known in the art.

Referring now to FIG. 4, a photoresist mask (not shown) is patterned over sacrificial oxide layer 24 defining MOS transistor area 19, collector regions 25 in bipolar junction transistor area 18, resistor area 80, MOS capacitor area 81. Sacrificial oxide layer 24 is removed from MOS transistor area 19, collector regions 25, and resistor contact regions 85 and MOS capacitor area 81 exposing the monocrystalline semiconductor layer in these areas. Removal of sacrificial oxide layer 24 from collector regions 25 forms collector contact regions 27. The photoresist mask is removed.

FIG. 5 illustrates a thin layer of gate oxide 26 formed over MOS transistor area 19, collector contact regions 27, resistor area 80, and MOS capacitor area 81. Preferably, gate oxide 26 is grown over the surface of wafer 10 covering bipolar junction and MOS transistor areas 18 and 19, respectively, as well as resistor area 80 and MOS capacitor area 81. Growing oxide layer 26 versus depositing this layer offers the option of selectivity because oxide layer 26 will selectively grow on silicon whereas deposition would be over the entire surface. It shall be understood that gate oxide 26 may be formed by an oxide deposition method as well as by a method comprising a combination of oxide growth and deposition.

A layer of conductive material 30 is formed over the surface of wafer 10. Preferably, layer of conductive material 30 is a deposited polysilicon layer having a thickness ranging between approximately 100 and 300 nm. It shall be understood that the type of conductive material for layer of conductive material 30 is not a limitation to the present invention. In other words, layer of conductive material 30 may be a metallic material, a superconductor material, or the like. Subsequent to formation of polysilicon layer 30, a thin layer of oxide 36 is formed over polysilicon layer 30. Preferably, layer of oxide 36 has a thickness of approximately 10 nm. Layer of oxide 36 may be formed by oxidation of a top portion of layer of polysilicon 30 in a dry atmosphere or by other methods well known to those skilled in the art.

In a first embodiment, enhancement mode MOS transistors are fabricated in MOS transistor area 19 and an NPN bipolar junction transistor is fabricated in bipolar junction transistor area 18. Accordingly, a portion 32 of layer of polysilicon 30 above P type doped region 22 is doped with an N type dopant. Simultaneously a portion 87 of layer of polysilicon 30 above doped region 82 is doped with the N type dopant. Portion 87 serves as a second plate of a MOS capacitor. Doped portion 32 serves as a gate region of an n-channel enhancement mode MOS transistor. Subsequently, a portion 31 of layer of polysilicon 30 above N type doped region 21 and portions 33 of layer of polysilicon 30 adjacent to collector regions 25 are doped with a P type dopant, thereby forming a gate region of a p-channel enhancement mode surface channel MOSFET and inactive base regions 33 of an NPN bipolar junction transistor, respectively. A layer of nitride 37 is deposited over layer of oxide 36. Preferably layer of nitride 37 has a thickness of approximately 100 nm.

In a second embodiment, portion 32 of layer of polysilicon 30 above P type doped region 22 is doped with an N type dopant. N type doped portion 32 serves as a gate region for an n-channel enhancement mode MOS transistor. Portions of layer of polysilicon 30 above N type doped region 21 and portions of layer of polysilicon 30 adjacent to collector regions 25 are doped with an N type dopant, thereby forming gate region 31 of a p-channel enhancement mode buried channel MOS transistor, and an inactive base region 33 of a PNP bipolar junction transistor, respectively. Thus, complementary bipolar junction transistors may be fabricated using the present invention. As in the first embodiment, portion 87 of layer of polysilicon 30 above doped region 82 is doped with the N type dopant thereby forming a second plate of a MOS capacitor. Further, a layer of nitride 37 is deposited over layer of oxide 36.

The doping profiles for the present invention have been described for enhancement mode MOS transistors. However, it should be understood that accumulation mode MOS transistors, commonly referred to as depletion mode MOS transistors, may be fabricated by appropriately doping gate regions 31 and 32 and the associated channel regions by methods well known to those skilled in the art.

Figure 6:
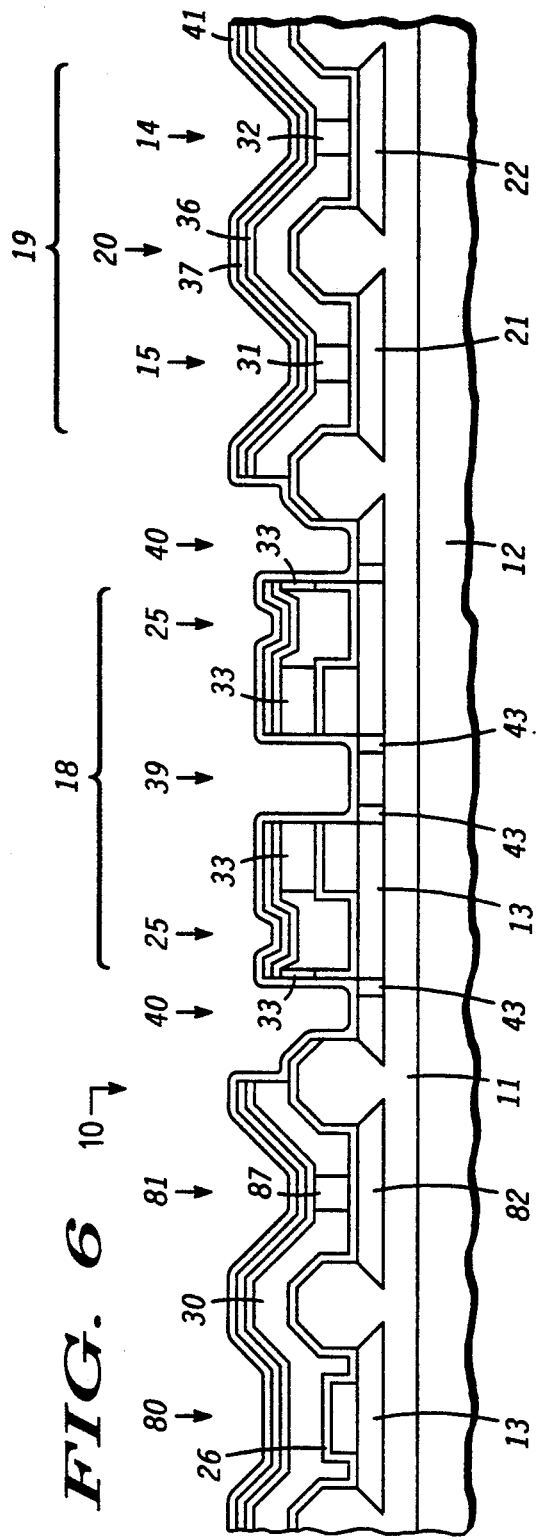
FIG. 6 shows the wafer of FIG. 5 having emitter openings and a layer of polysilicon over a surface of the wafer in accordance with the present invention.

FIG. 6 illustrates a cross-sectional view of emitter openings 39 and 40 defined using photolithographic techniques. Subsequent to definition of emitter openings 39 and 40, layer of nitride 37, layer of oxide 36, layer of polysilicon 30, and sacrificial oxide layer 24 are removed from the locations of emitter openings 39 and 40. In one embodiment, emitter opening 39 is formed such that a portion of inactive base region 33 is adjacent to emitter opening 39 and, although not shown, inactive base region 33 forms an annular structure surrounding emitter opening 39. Further, emitter openings 40 are formed such that a portion of inactive base region 33 is between each emitter opening 40 and each collector region 25. In the embodiment illustrated in FIG. 6, emitter opening 39 is a double emitter structure whereas emitter openings 40 are single emitter structures. In yet another embodiment (not shown), the emitter structures may be formed only as a single emitter structures.

A second layer of conductive material 41 is deposited over the surface of wafer 10. Although the thickness of second layer of polysilicon 41 may range from approximately 30 to 100 nm, preferably the thickness of second layer of polysilicon 41 is approximately 50 nm.

In the NPN bipolar junction transistor embodiment, layer of polysilicon 41 and portions of thin film 13 underlying emitter openings 39 and 40 are doped with a P type dopant thereby forming doped portions 43. Doped portions 43 of thin film 13 serve as active base regions.

Referring now to FIG. 7, layer of polysilicon 41 over layer of nitride 37 is anisotropically etched, thereby removing layer of polysilicon 41 and leaving polysilicon spacers 42 along sidewalls or edges 70 of emitter openings 39 and 40. Polysilicon spacers 42 serve to link active base regions 43 to respective inactive base regions 33. It shall be understood that the doping of layer of polysilicon 41 and thin film 13 exposed by emitter openings 39 and 40 may be performed after formation of spacers 42 rather than prior to formation of spacers 42.

Referring now to FIG. 8, p-channel MOS transistor portion 15, n-channel MOS transistor portion 14, collector regions 25, resistor area 80, and MOS capacitor area 81 are patterned using a photolithographic technique. Subsequently, layer of nitride 37, layer of oxide 36, layer of polysilicon 30, and gate oxide 26 are removed from patterned portions 14 and 15, patterned regions 25, patterned areas 80 and 81; thereby uncovering source and drain regions 45 and 46 of p-channel MOS transistor portion 15 as well as source and drain regions 47 and 48 of n-channel MOS transistor portion 14. Collector contact region 27, portions 88 of doped region 82, and resistor contact regions 85 are also uncovered during the step of uncovering the source and drain regions. Removal of these layers leaves a p-channel gate region 31 between source and drain regions 45 and 46, and an n-channel gate region 32 between source and drain regions 47 and 48. In addition, removal of these layers leaves portion 87 between the portions 88. Portion 87 serves as a second plate of a MOS capacitor whereas uncovered portions 88 allow contact to region 82 which serves as a first plate of a MOS capacitor.

FIG. 9 illustrates a layer of oxide 52 formed over the surface of wafer 10. Preferably, layer of oxide 52 has a thickness ranging between approximately 70 and 250 nm. Source and drain regions 45 and 46, respectively, of the p-channel MOS transistor are doped with a P type dopant. Source and drain regions 47 and 48, respectively, of the n-channel MOS transistor, emitter regions 44 and portions of collector contact region 27 of bipolar junction transistor area 19 are doped with an N type dopant. Resistor region 80 may be doped with an N or P type dopant. The dopant concentration of resistor region 80 is selected as a function of a desired resistor value.

As illustrated in FIG. 10, layer of oxide 52 is anisotropically etched, wherein the step of anisotropically etching layer of oxide 52 leaves oxide spacers 54 along the polysilicon spacers 42 of emitter openings 39 and 40, edges or sidewalls 71 of collector regions 25, and along the sidewalls 72 and 73 of gate regions 22 and 32, respectively but removes layer of oxide 52 elsewhere. Oxide spacers 54 are also referred to as dielectric spacers. A layer of oxide 53 is formed over the surface of wafer 10. Oxide spacers 54 are enlarged by anisotropically etching layer of oxide 53 from the same regions from which layer of oxide 52 was anisotropically removed. The step of anisotropically etching layer of oxide 53 enlarges spacers 54 above the polysilicon spacers 42 of emitter openings 39 and 40, along sidewalls 71 of collector regions 25, and along the sidewalls 72 and 73 of gate regions 22 and 32, respectively but removes layer of oxide 53 elsewhere. Since oxide layer 53 serves to merely enlarge spacers 54, oxide spacers 54 are shown as having a single layer. However it should be recognized that spacers 54 as described are formed in a two step process.

It shall be understood that oxide spacers 54 may be formed in a one step process, however the two step process is preferred because it allows a deeper emitter-base junction which improves the bipolar device characteristics. For example, increasing the spacer thickness in the second step increases the emitter-base junction depth, which decreases the base current. The collector current remains essentially unchanged, thus the gain of the bipolar transistor increases.

Figure 11:
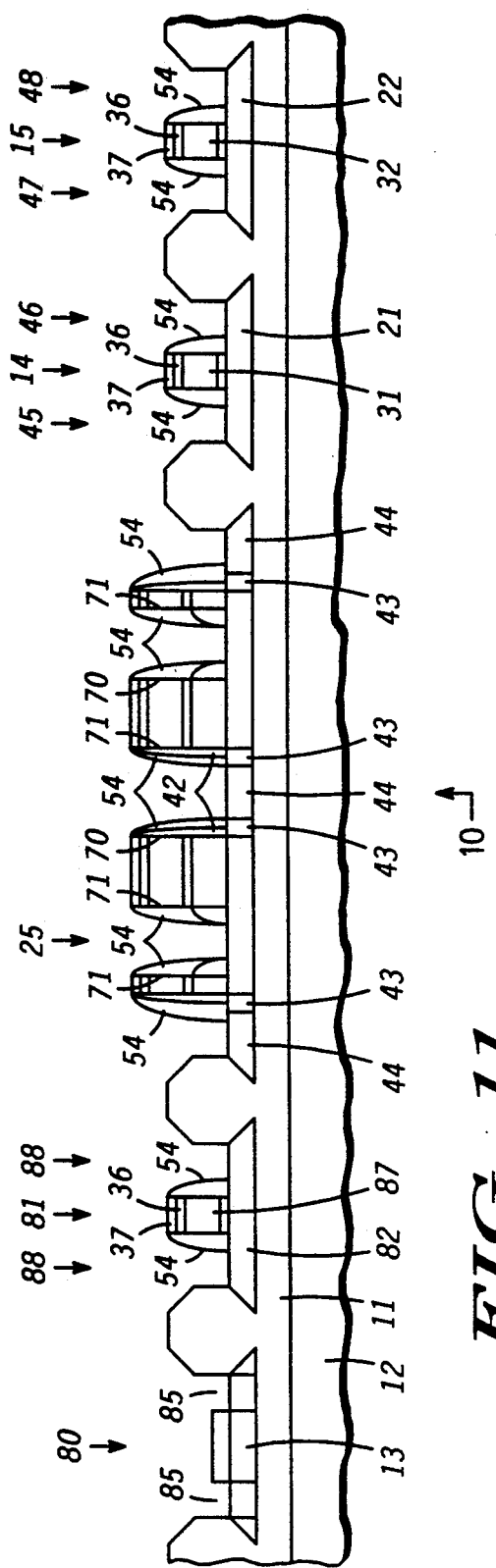
FIG. 11 shows the wafer of FIG. 10 after enlarging the dielectric spacers.

FIG. 11 illustrates the enlarged spacers 54.

Figure 12:
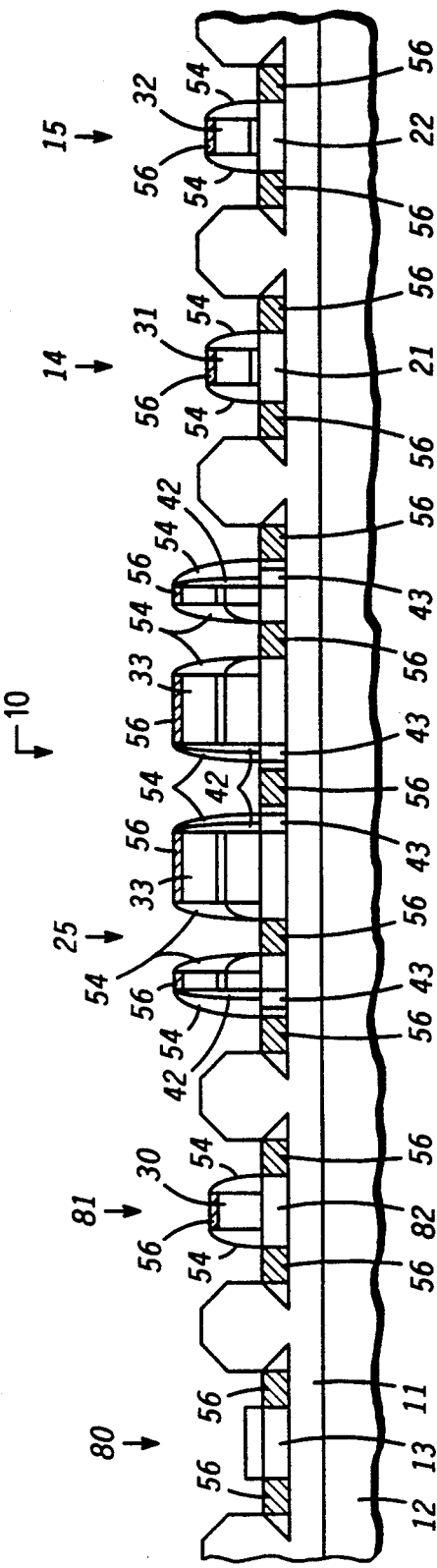
FIG. 12 shows the wafer of FIG. 11 after formation of electrically conductive contacts.

Referring now to FIG. 12, nitride layer 37 and oxide layer 36 are removed from wafer 10. More particularly, layers 36 and 37 are removed from gate regions 22 and 32, from inactive base regions 33, from resistor contact regions 85, and from a first capacitor plate contact regions 88 and a second capacitor plate contact region 87. Electrically conductive contacts 56 are formed in inactive base regions 33, emitter regions 44, collector contact regions 27, gate regions 31 and 32 and source regions 45 and 46, drain regions 48 and 49, resistor contact regions 85, uncovered portions 88, and second capacitor plate contact region 87. Preferably contacts 56 are a silicide structure and more particularly a silicide structure comprising titanium and silicon. Methods of forming silicide electrical contacts are well known to those skilled in the art.

Although the BiCMOS device of the present invention has been described as an NPN bipolar junction transistor integrated with an enhancement mode MOS device, this structure is not a limitation of the present invention. BiCMOS devices having structures such as a PNP transistor integrated with an enhancement mode MOS device, or BiCMOS devices wherein the MOS transistors are accumulation mode devices are easily manufactured by merely switching the dopant types in the base region of the bipolar junction transistor or source and drain regions of the the MOS transistors. Both NPN and PNP bipolar junction transistors may be manufactured, thus complementary bipolar junction transistors may be manufactured in accordance with the present invention.

Figure 13:
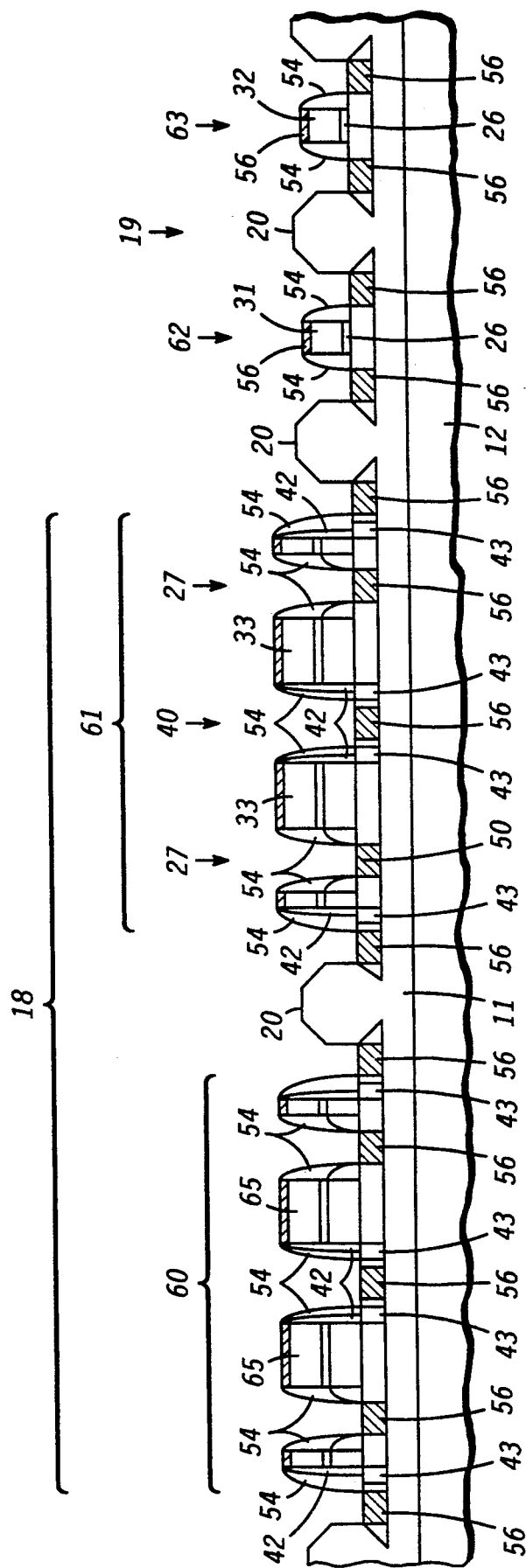
FIG. 13 shows a highly enlarged cross-sectional view of complementary bipolar junction and MOS transistors in accordance with the present invention.

FIG. 13 illustrates a cross-sectional side view of a transistor structure having both NPN and PNP transistors, and MOS transistors monolithically integrated in accordance with the present invention. Bipolar junction transistor region 18 includes an NPN bipolar junction transistor 60 and a PNP bipolar junction transistor 61. MOS transistor area 19 includes a p-channel MOS transistor 62 and an n-channel MOS transistor 63. Transistors 60, 61, 62, and 63 are manufactured as detailed in the description of FIGS. 1-12. PNP transistor 61 is formed by doping base region 65 with an N type dopant during the step of doping gate region 32 of the n-channel enhancement mode MOS transistor.

By now it should be appreciated that the present invention provides a method for fabricating both complementary bipolar and CMOS transistors on SOI. The method may use, for example, two layers of polycrystalline silicon and the transistor elements are inherently self aligned. The method provides bipolar transistors having especially low base parasitics due to the extremely short, direct base contact. Isolation between transistors is easily provided by use of dielectric isolation which inherently exhibits low leakage and low capacitance. The very thin film used as a starting wafer minimizes side encroachment giving tight control of structure size and allowing fabrication of extremely small devices.

Further, the present invention allows formation of passive circuit components such as monocrystalline silicon resistors wherein the resistors are isolated, both laterally and vertically by a dielectric material. Thus, the monocrystalline silicon resistors fabricated in accordance with the present invention lack limitations such as nonlinear current-voltage characteristics, parasitic junction capacitance associated with a diffused resistor and an underlying region in, for example, diffused resistors. Further, the breakdown voltages of these monocrystalline silicon resistors are higher than those of diffused resistors. Thus, the monocrystalline silicon resistors manufactured in accordance with the present invention offer all the advantages of thin film resistors such as polysilicon resistors but without the negative temperature coefficient for high resistivity resistors.

Moreover, MOS capacitors may be formed from the oxide isolated monocrystalline silicon material wherein the parasitic capacitances of, for example, the p-n junction associated with the MOS capacitor bottom plate, are eliminated. As a result of the very low parasitic resistances and capacitances the transistors are capable of achieving extremely high performance. Finally, the method integrates fabrication of both the bipolar and CMOS transistors into a single manufacturing flow.

We claim:

1. A method for fabricating bipolar junction and MOS transistors on SOI, comprising the steps of:
   providing a wafer which comprises a plurality of thin film semiconductor areas on an oxide insulating layer;
   forming a first doped region and a second doped region in a first of the plurality of thin film monocrystalline semiconductor areas, the first and the second doped regions of opposite dopant types;
   forming an insulating layer over the plurality of thin film semiconductor areas;
   providing a conductive material over the insulating layer;
   doping portions of the conductive material wherein the portions include a portion of conductive material over the first doped region, a portion of conductive material over the second doped region, and a portion of conductive material over a second of the plurality of thin film semiconductor areas, the portions serving as a first gate region, a second gate region, and an inactive base region, respectively;
   forming an emitter opening in the conductive material and underlying insulating layer adjacent the inactive base region, the emitter opening exposing a portion of an emitter region;
   forming a doped semiconductor spacer along an edge of the emitter opening;
   forming a collector contact region in the second of the plurality of thin film semiconductor areas, the collector contact region spaced apart from the emitter opening;
   uncovering a first source region, a first drain region, a second source region, and a second drain region in the first of the plurality of thin film semiconductor areas, wherein the first source and drain regions are separated by the first gate region and the second source and second drain regions are separated by the second gate region;
   forming a dielectric spacer along an edge of the collector contact region, an edge of the first gate region, an edge of the second gate region, and over the semiconductor spacer;
   providing an impurity material of a first conductivity type in the first source and drain regions in the collector contact region and through the emitter openings;
   providing an impurity material of a second conductivity type in the second source and drain regions; and
   providing electrically conductive contacts to the collector region, the emitter region, the inactive base region, the first gate region, the first source and drain regions, the second gate region, and the second source and drain regions.

2. A method for fabricating bipolar junction and MOS transistors on SOI as claimed in claim 1, wherein the step of providing an electrically conductive contact includes providing a silicide as the electrically conductive contact material.

3. A method for fabricating bipolar junction and MOS transistors on SOI as claimed in claim 1, including providing an N type dopant for the first doped region and the second gate region, and a P type dopant for the second doped region, the first gate region, the inactive base region, and the doped semiconductor spacer.

4. A method for fabricating bipolar junction and MOS transistors on SOI as claimed in claim 1, wherein the step of providing electrically conductive contacts includes enlarging the dielectric spacer along the edge of the collector contact region, the edge of the first gate region, and the edge of the second gate region prior to providing the electrically conductive contacts.

5. A method for fabricating bipolar junction and MOS transistors on SOI as claimed in claim 1, further including forming a passive circuit component in at least one of the plurality of thin film semiconductor areas.

6. A method for fabricating bipolar junction and MOS transistors on SOI as claimed in claim 5, wherein the step of forming a passive circuit component includes forming a resistor.

7. A method for fabricating both bipolar junction and MOS transistors on a thin film silicon on insulator substrate, comprising the steps of:
   providing a silicon on insulator substrate comprising a tri-layer structure having an oxide insulating layer sandwiched between a first and a second layer of silicon;
   separating the first layer of silicon into a plurality of device areas, the plurality of device areas including at least one bipolar junction transistor area and at least one MOS transistor area;
   forming a sacrificial oxide layer on the plurality of device areas;
   forming at least one doped region in the at least one MOS transistor area;
   removing the sacrificial oxide layer from the at least one MOS transistor area and from a collector region of the at least one bipolar junction transistor area;
   forming a gate oxide on the first layer of silicon in the at least one MOS transistor area;
   depositing a conductive layer over the at least one bipolar junction transistor area and the at least one MOS transistor area wherein the conductive layer extends contiguously from the at least one bipolar junction transistor area to the at least one MOS transistor area;
   doping an inactive base region of the at least one bipolar junction transistor area and at least one gate region of the at least one MOS transistor area with a dopant of a second conductivity type, wherein the at least one gate region is above the at least one doped region;

forming an oxide layer on the conductive layer;

forming a nitride layer on the oxide layer;

forming an opening in an emitter region of the at least one bipolar junction transistor area, the emitter region spaced apart from the collector region;

forming a layer of polysilicon over the second layer of nitride and in the opening in the emitter region;

forming a polysilicon spacer along a sidewall of the opening in the emitter region, wherein the polysilicon spacer serves as a link to an active base region;

doping the polysilicon spacer with the dopant of the second conductivity type;

selectively removing the nitride layer, the oxide layer, and the layer of polysilicon from the bipolar junction and MOS transistor areas, wherein the step of selectively removing forms at least one source region, at least one drain region, and at least one collector contact region;

selectively forming an oxide spacer along a sidewall of the first portion of the at least one collector contact region, and along a sidewall of the at least one gate region, and on the polysilicon spacer;

doping the emitter and the collector regions of the at least one bipolar junction transistor area, and the at least one source region and the at least one drain region of the MOS transistor area with a dopant of a first conductivity type;

enlarging the oxide spacer, wherein the oxide spacer is along the sidewall of the first portion of the at least one collector contact region, and along a sidewall of the at least one gate region, and on the polysilicon spacer;

removing the layer of nitride and the layer of oxide from the at least one gate region and the inactive base region; and forming an electrically conductive contact in the inactive base, the collector, and the emitter regions of the at least one bipolar junction transistor area and the at least one drain, gate, and source regions of the at least one MOS transistor region.

8. A method for fabricating both bipolar junction and MOS transistors on a thin film silicon on insulator substrate as claimed in claim 7, wherein the step of forming at least one isolation well comprises:

forming a first doped region of a first conductivity type; and forming a second doped region of a second conductivity type spaced apart from the first isolation well.

9. A method for fabricating both bipolar junction and MOS transistors on a thin film silicon on insulator substrate as claimed in claim 8, wherein the step of doping the inactive base region comprises:

doping a first gate region with a dopant of a first conductivity type wherein the first gate region is over the second doped region of a second conductivity type; and doping a second gate region with a dopant of a second conductivity type wherein the second gate region is over the first doped region of the first conductivity type.

10. A method for fabricating both bipolar junction and MOS transistors on a thin film silicon on insulator substrate as claimed in claim 9, wherein the step of doping the inactive base region further comprises doping a first inactive base region with a dopant of a second conductivity type and a second inactive base region with a dopant of a first conductivity type.

11. A method for fabricating both bipolar junction and MOS transistors on a thin film silicon on insulator substrate as claimed in claim 9, wherein the step of doping the active base region comprises:

doping a first active base region with a dopant of the first conductivity type; and doping a second active base region with a dopant of the second conductivity type.

12. A method for fabricating both bipolar junction and MOS transistors on a thin film silicon on insulator substrate as claimed in claim 7 wherein the step of doping the emitter and the collector regions of the at least one bipolar junction transistor, and the at least one source region and the at least one drain region of the MOS transistor area includes doping these regions with a dopant of the first conductivity type.

13. A method for fabricating both bipolar junction and MOS transistors on a thin film silicon on insulator substrate as claimed in claim 7 wherein the step of forming an electrically conductive contact in the inactive base region, the collector region, the emitter region, the drain region, the gate region, and the source region includes forming the electrically conductive contact as a silicide.

14. A method for fabricating bipolar junction transistors and MOS transistors on SOI, comprising the steps of:

providing a wafer which comprises a thin film of monocrystalline silicon above an oxide insulating layer;

providing a first layer of dielectric material over the thin film of monocrystalline silicon;

providing a second layer of dielectric material wherein the second layer of dielectric material is over the first layer of dielectric material;

defining a bipolar junction transistor area and a MOS transistor area, wherein the step of defining the bipolar junction and the MOS transistor areas includes separating the bipolar junction and the MOS transistor areas by a dielectric structure;

removing the first and the second layers of dielectric material;

providing a sacrificial layer of dielectric material over the bipolar junction and MOS transistor areas;

providing an impurity material of a first conductivity type in a first portion of the MOS transistor area and an impurity material of a second conductivity type in a second portion of the MOS transistor area;

removing the sacrificial layer of dielectric material from a collector region of the bipolar junction transistor area and from the MOS transistor area;

forming a thin layer of dielectric material over the bipolar junction and MOS transistor areas, wherein the thin layer extends contiguously from the bipolar junction transistor area to the MOS transistor area;

depositing a first layer of semiconductor material over the thin layer of dielectric material;

providing a third layer of dielectric material, the third layer of dielectric material over the first layer of semiconductor material;

providing a fourth layer of dielectric material, the fourth layer of dielectric material over the third layer of dielectric material;

exposing an emitter region in the bipolar junction transistor area, the emitter region spaced apart from the collector region;

providing a second layer of semiconductor material, the second layer of semiconductor material over the fourth layer of dielectric material and in the emitter region;

doping a link from the inactive base region to the active base region wherein the link is along a sidewall of the emitter region;

anisotropically removing the second layer of semiconductor material from the fourth layer of dielectric material, wherein the step of anisotropically removing the second layer of semiconductor material forms a polysilicon spacer along the sidewall of the emitter region, the polysilicon spacer serving as the link to the active base region;

selectively removing the second and third layers of dielectric material and the first layer of semiconductor material from the collector region, and the first and second regions of the MOS transistor area, wherein the step of selectively removing forms a source region, separated from a drain region by a gate region in the first and second regions of the MOS transistor area;

forming dielectric spacers along a sidewall of the collector and along the emitter regions and along the gate region of the first and second MOS transistor areas;

providing an impurity material of a first conductivity type in the at least one source and drain regions and the base region;

enlarging the dielectric spacers along the sidewall of the collector and along the emitter regions and along the gate region of the first and second MOS transistor areas; and forming a silicide in a base contact region, the collector region, the emitter region, the drain region, the gate region, and the source region.

15. A method for fabricating both complementary bipolar junction and MOS transistors on SOI as claimed in claim 14 including providing oxide as the first dielectric material and nitride as the second dielectric material.

16. A method for fabricating both complementary bipolar junction and MOS transistors on SOI as claimed in claim 14 separating the bipolar junction and the MOS transistor areas by a local oxidation of silicon method.

17. A method for fabricating both complementary bipolar junction and MOS transistors on SOI as claimed in claim 14 wherein the step of providing an impurity material of a first conductivity type includes providing an impurity material of N conductivity type.

18. A method for fabricating both complementary bipolar junction and MOS transistors on SOI as claimed in claim 14 further including forming at least one passive circuit element in the thin film of monocrystalline silicon.

19. A method for fabricating both complementary bipolar junction and MOS transistors on SOI as claimed in claim 18 further including forming the at least one passive circuit element as a resistor.

20. A method for fabricating both complementary bipolar junction and MOS transistors on SOI as claimed in claim 14 further including forming an MOS capacitor from a portion of the first layer of semiconductor material.

* * * * *